(12) United States Patent
Pagaila et al.

(10) Patent No.: US 9,293,385 B2
(45) Date of Patent: Mar. 22, 2016

(54) RDL PATTERNING WITH PACKAGE ON PACKAGE SYSTEM

(75) Inventors: Reza Argenty Pagaila, Singapore (SG); Byung Tai Do, Singapore (SG); Dioscoro A. Merilo, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 819 days.

(21) Appl. No.: 12/182,132

(22) Filed: Jul. 30, 2008

(65) Prior Publication Data

US 2010/0025833 A1 Feb. 4, 2010

(51) Int. Cl.
| | |
|---|---|
| *H01L 23/31* | (2006.01) |
| *H01L 21/56* | (2006.01) |
| *H01L 23/00* | (2006.01) |
| *H01L 25/10* | (2006.01) |
| H01L 23/495 | (2006.01) |
| H01L 23/498 | (2006.01) |
| H01L 23/538 | (2006.01) |

(52) U.S. Cl.
CPC .......... *H01L 23/3128* (2013.01); *H01L 21/561* (2013.01); *H01L 24/97* (2013.01); *H01L 25/105* (2013.01); *H01L 23/49548* (2013.01); *H01L 23/49816* (2013.01); *H01L 23/5389* (2013.01); *H01L 24/48* (2013.01); *H01L 2224/16* (2013.01); *H01L 2224/16225* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/8592* (2013.01); *H01L 2224/97* (2013.01); *H01L 2225/1023* (2013.01); *H01L 2225/1041* (2013.01); *H01L 2225/1058* (2013.01); *H01L 2225/1088* (2013.01); *H01L 2924/01027* (2013.01); *H01L 2924/01033* (2013.01); *H01L 2924/14* (2013.01); *H01L 2924/15331* (2013.01); *H01L 2924/15787* (2013.01); *H01L 2924/181* (2013.01); *H01L 2924/1815* (2013.01)

(58) Field of Classification Search
USPC .......................... 257/777, 787, 666; 438/127; 361/760–764, 767, 768, 776, 783
See application file for complete search history.

(56) References Cited

U.S. PATENT DOCUMENTS

| | | | |
|---|---|---|---|
| 5,333,505 | A | 8/1994 | Takahashi et al. |
| 5,373,189 | A | 12/1994 | Massit et al. |
| 5,950,070 | A | 9/1999 | Razon et al. |
| 6,043,109 | A | 3/2000 | Yang et al. |
| 6,239,496 | B1 | 5/2001 | Asada |

(Continued)

FOREIGN PATENT DOCUMENTS

| | | |
|---|---|---|
| JP | 2000228468 A | 8/2000 |
| TW | 200410345 | 6/2004 |

(Continued)

OTHER PUBLICATIONS

Office Action from TW Application No. 97142598 dated Sep. 20, 2012.

*Primary Examiner* — Mark Tornow
*Assistant Examiner* — Abbigale Boyle
(74) *Attorney, Agent, or Firm* — Ishimaru & Associates LLP

(57) ABSTRACT

An integrated circuit package system includes: providing an internal device; encapsulating the internal device with an encapsulation having an outer surface; and forming a redistribution line having connection points on the outer surface of the encapsulation.

10 Claims, 6 Drawing Sheets

(56) References Cited

U.S. PATENT DOCUMENTS

| | | |
|---|---|---|
| 6,252,308 B1 | 6/2001 | Akram et al. |
| 6,268,654 B1 | 7/2001 | Glenn et al. |
| 6,291,884 B1 | 9/2001 | Glenn et al. |
| 6,340,846 B1 | 1/2002 | LoBianco et al. |
| 6,401,545 B1 | 6/2002 | Monk et al. |
| 6,492,726 B1 | 12/2002 | Quek et al. |
| 6,633,081 B2 * | 10/2003 | Sahara et al. ............... 257/738 |
| 6,653,723 B2 | 11/2003 | Manansala |
| 6,727,579 B1 | 4/2004 | Eldridge et al. |
| 6,730,543 B2 | 5/2004 | Akram |
| 6,861,288 B2 * | 3/2005 | Shim et al. ............... 438/109 |
| 6,962,282 B2 | 11/2005 | Manansala |
| 6,995,448 B2 | 2/2006 | Lee et al. |
| 6,998,721 B2 | 2/2006 | Zhou |
| 7,026,709 B2 | 4/2006 | Tsai et al. |
| 7,026,710 B2 | 4/2006 | Coyle et al. |
| 7,031,500 B1 | 4/2006 | Shinohara |
| 7,138,706 B2 * | 11/2006 | Arai et al. ............... 257/678 |
| 7,161,237 B2 | 1/2007 | Lee |
| 7,187,067 B2 | 3/2007 | Weng et al. |
| 7,189,593 B2 | 3/2007 | Lee |
| 7,196,415 B2 * | 3/2007 | Zhong et al. ............... 257/712 |
| 7,208,345 B2 | 4/2007 | Meyer et al. |
| 7,227,253 B2 | 6/2007 | Tsai et al. |
| 7,245,008 B2 * | 7/2007 | Lee ............... 257/686 |
| 7,276,393 B2 | 10/2007 | Derderian et al. |
| 7,288,835 B2 | 10/2007 | Yim et al. |
| 7,298,033 B2 | 11/2007 | Yoo |
| 7,307,340 B2 | 12/2007 | Baek et al. |
| 7,309,913 B2 | 12/2007 | Shim et al. |
| 7,335,987 B2 | 2/2008 | Huang |
| 7,354,800 B2 | 4/2008 | Carson |
| 7,364,945 B2 | 4/2008 | Shim et al. |
| 7,391,105 B2 | 6/2008 | Yeom |
| 7,468,556 B2 | 12/2008 | Logan et al. |
| 7,501,697 B2 | 3/2009 | Yim et al. |
| 7,504,284 B2 | 3/2009 | Ye et al. |
| 7,521,790 B2 | 4/2009 | Tanida et al. |
| 7,535,086 B2 | 5/2009 | Merilo et al. |
| 7,557,443 B2 | 7/2009 | Ye et al. |
| 7,589,408 B2 | 9/2009 | Weng et al. |
| 7,683,469 B2 | 3/2010 | Oh et al. |
| 2002/0030261 A1 | 3/2002 | Rolda, Jr. et al. |
| 2003/0025188 A1 | 2/2003 | Farnworth et al. |
| 2003/0094683 A1 | 5/2003 | Poo et al. |
| 2004/0026773 A1 | 2/2004 | Koon et al. |
| 2004/0262734 A1 | 12/2004 | Yoo |
| 2005/0205978 A1 | 9/2005 | Pu et al. |
| 2005/0205996 A1 | 9/2005 | Usui et al. |
| 2005/0253241 A1 | 11/2005 | Hall |
| 2006/0014328 A1 | 1/2006 | Shimonaka et al. |
| 2006/0076690 A1 | 4/2006 | Khandros et al. |
| 2006/0171698 A1 | 8/2006 | Ryu et al. |
| 2006/0256525 A1 | 11/2006 | Shim et al. |
| 2007/0108581 A1 | 5/2007 | Shim et al. |
| 2007/0108583 A1 * | 5/2007 | Shim et al. ............... 257/686 |
| 2007/0181989 A1 | 8/2007 | Corisis et al. |
| 2007/0181990 A1 | 8/2007 | Huang et al. |
| 2007/0190690 A1 | 8/2007 | Chow et al. |
| 2007/0200257 A1 | 8/2007 | Chow et al. |
| 2007/0241442 A1 | 10/2007 | Ha et al. |
| 2007/0246815 A1 | 10/2007 | Lu et al. |
| 2007/0278696 A1 | 12/2007 | Lu et al. |
| 2008/0012111 A1 | 1/2008 | Pu et al. |
| 2008/0157325 A1 | 7/2008 | Chow et al. |
| 2008/0217761 A1 * | 9/2008 | Yang et al. ............... 257/700 |
| 2008/0284043 A1 * | 11/2008 | Hagen ............... H01L 23/4985 257/777 |
| 2009/0152692 A1 | 6/2009 | Chow et al. |
| 2009/0152700 A1 | 6/2009 | Kuan et al. |
| 2009/0152706 A1 | 6/2009 | Kuan et al. |
| 2009/0155960 A1 | 6/2009 | Chow et al. |
| 2009/0243069 A1 | 10/2009 | Camacho et al. |
| 2009/0294941 A1 * | 12/2009 | Oh ............... H01L 23/367 257/686 |
| 2010/0025835 A1 * | 2/2010 | Oh ............... H01L 25/105 257/686 |

FOREIGN PATENT DOCUMENTS

| | | |
|---|---|---|
| TW | 200614393 | 5/2006 |
| TW | 200707697 | 2/2007 |
| TW | 200707700 | 2/2007 |

* cited by examiner

RDL PATTERNING WITH PACKAGE ON PACKAGE SYSTEM

CROSS-REFERENCE TO RELATED APPLICATION(S)

The present application contains subject matter related to U.S. patent application Ser. No. 11/954,601, now U.S. Pat. No. 8,536,692. The related application is assigned to STATS ChipPAC Ltd.

The present application also contains subject matter related to co-pending U.S. patent application Ser. No. 12/055,612. The related application is assigned to STATS ChipPAC Ltd.

TECHNICAL FIELD

The present invention relates generally to integrated circuits and more particularly to a system for utilizing a redistribution line on a package on package system.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system includes: providing an internal device; encapsulating the internal device with an encapsulation having an outer surface; and forming a redistribution line having connection points on the outer surface of the encapsulation.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
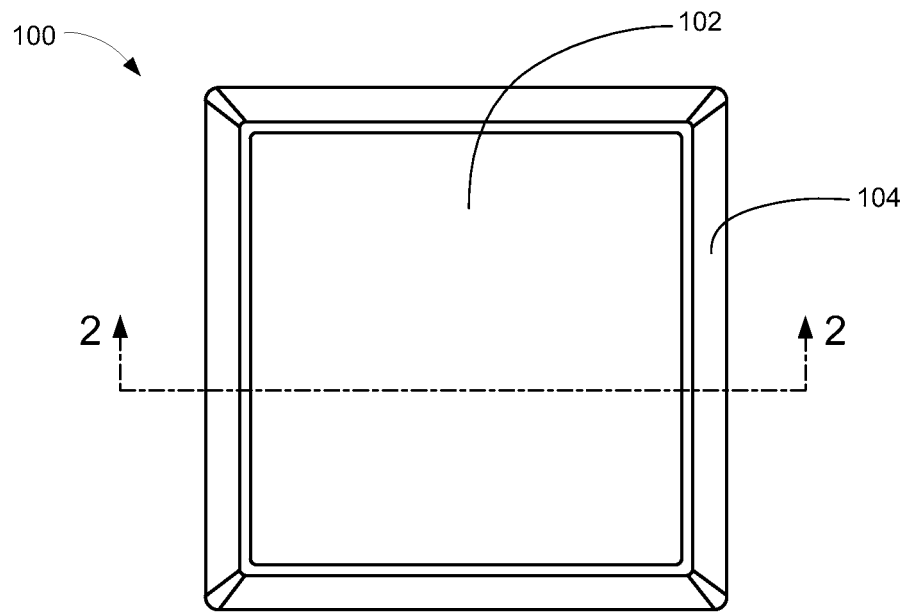
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS. The same numbers are used in all the drawing FIGS. to relate to the same elements.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure. The term "system" as used herein refers to and is defined as the method and as the apparatus of the present invention in accordance with the context in which the term is used.

Referring now to FIG. 1, therein is shown a top view of an integrated circuit package system 100 in a first embodiment of the present invention. The integrated circuit package system 100 is shown having a second external device 102 mounted over a redistribution line (RDL) 104.

Figure 2:
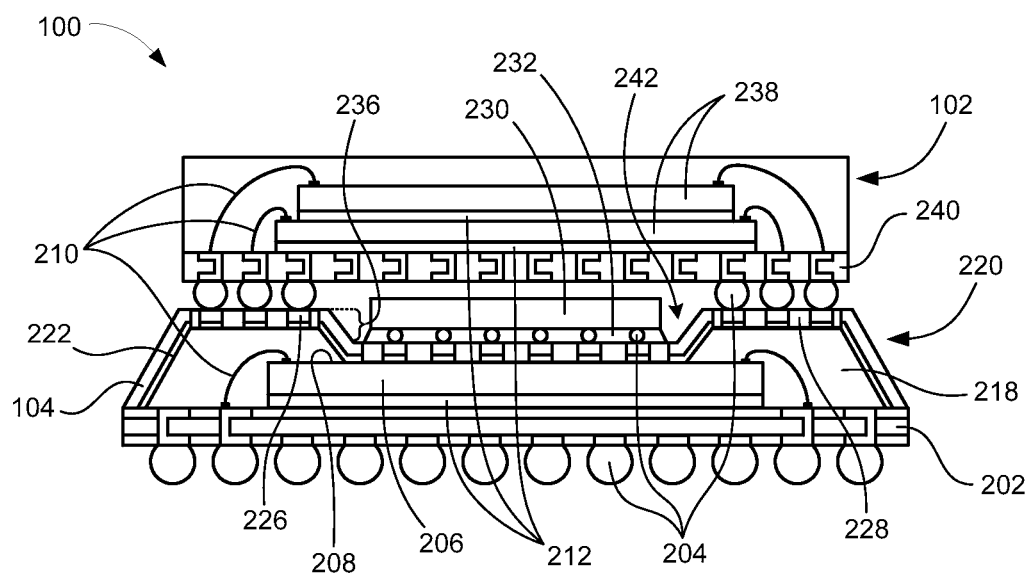
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having a substrate 202 such as a laminated plastic or ceramic substrate.

Mounted below the substrate 202 are interconnects, such as solder balls 204. Mounted above the substrate 202 is an internal device 206 such as an integrated circuit die with a functional side 208. The functional side 208 of the internal device 206 is connected to the substrate 202 with bond wires 210.

The internal device 206 is attached to the substrate 202 with a die attach adhesive 212. Partially encapsulating the internal device 206 is an encapsulation 218. The encapsulation 218, such as an epoxy mold compound, has mold risers 220. In at least one embodiment, the encapsulation 218 can include a cavity 242 for accommodating, holding or bounding one or more of a device or package. In such cases, the cavity 242 can be at least partially lined with the RDL 104 and the cavity 242 can include at least one dimension that exceeds a footprint of a device or package, such as a first external device 230.

The encapsulation 218 has an outer surface 222. Attached to the outer surface 222 is the redistribution line (RDL) 104. The RDL 104 conducts electrical signals, routing them between connection points 226. The RDL 104 is in direct contact with the mold riser 220, covering a top surface of the mold riser 220. The RDL 104 extends downward toward the internal device 206 over the outer surface 222 along the cavity 242 and toward a central portion of the internal device 206.

The RDL 104 covers the outer surface 222 of the encapsulation 218 and is in direct contact with a portion of the functional side 208 of the internal device 206. The RDL 104 may also have an insulator such as a solder mask 228 between connection points 226. The solder mask 228 may be a liquid photoimageable solder mask (LPSM) or dry film photoimageable solder mask (DFSM).

The solder mask 228 prevents solder from bridging between the connection points 226 and the RDL 104, thereby preventing short circuits. Mounted above the internal device 206 and the RDL 104 is the first external device 230 such as a wafer level chip scale package (WLCSP), a redistributed line (RDL) die, or an area array package.

The first external package 230 is connected to the RDL 104 with the solder balls 204. Between the solder balls 204 is an under-fill 232. The under-fill 232 helps to stabilize the first external device 230 and to secure the solder balls 204.

Mounted above the first external device 230 is the second external device 102. The second external device 102 is connected to the mold risers 220 with the solder balls 204. The mold risers 220 provide a standoff height 236, which allows the second external device 102 to have a finer pitch.

The second external device 102 is shown having two wire-bonded die 238 connected to an external device substrate 240 with the bond wires 210. The two wire-bonded die 238 are attached with the die attach adhesive 212.

The RDL 104 electrically connects the substrate 202 to the second external device 102, the first external device 230 and the internal device 206. The RDL 104 is in direct contact with the substrate 202.

Figure 3:
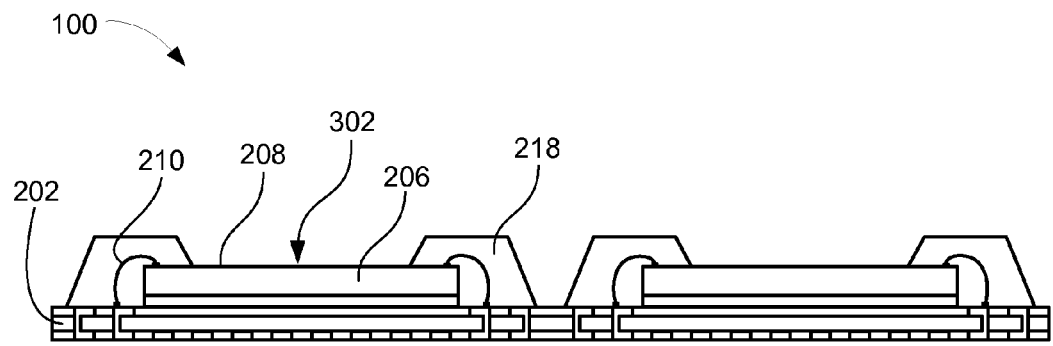
FIG. 3 is the integrated circuit package system of FIG. 2 in an encapsulation phase of manufacture.

Referring now to FIG. 3, therein is shown the integrated circuit package system 100 of FIG. 2 in an encapsulation phase of manufacture. The integrated circuit package system 100 is shown having the internal device 206 partially encapsulated and partially exposed by the encapsulation 218.

The internal device 206 is shown having the functional side 208 connected to the substrate 202 with the bond wires 210. An exposed surface 302 of the internal device 206 is shown exposed from the encapsulation 218.

Figure 4:
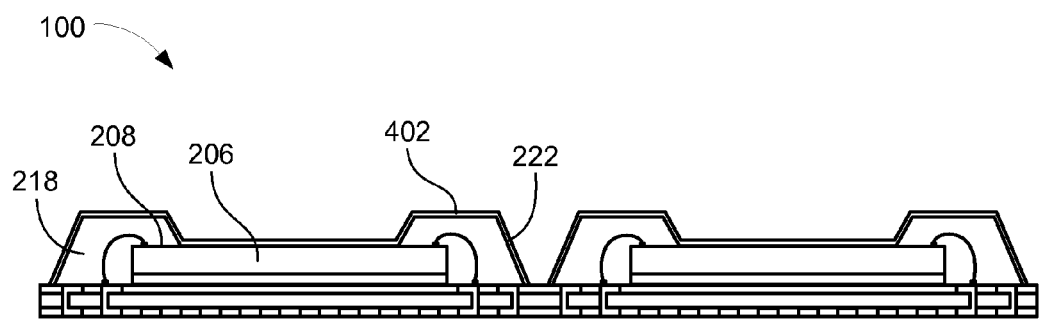
FIG. 4 is the integrated circuit package system of FIG. 2 in a thin-metal phase of manufacture.

Referring now to FIG. 4, therein is shown the integrated circuit package system 100 of FIG. 2 in a thin-metal phase of manufacture. The integrated circuit package system 100 is shown having a seed layer 402 plated to the outer surface 222 of the encapsulation 218 and to the functional side 208 of the internal device 206. The seed layer 402 may be 2 µm to 5 µm.

Figure 5:
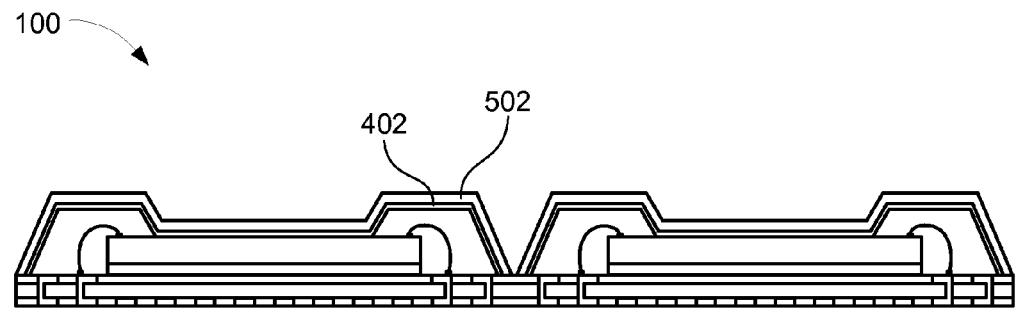
FIG. 5 is the integrated circuit package system of FIG. 2 in thick-metal phase of manufacture.

Referring now to FIG. 5, therein is shown the integrated circuit package system 100 of FIG. 2 in thick-metal phase of manufacture. The integrated circuit package system 100 is shown having a thick metal layer 502 plated on the seed layer 402. The thick metal layer 502 is thicker than the seed layer 402 and may be 12 µm.

Figure 6:
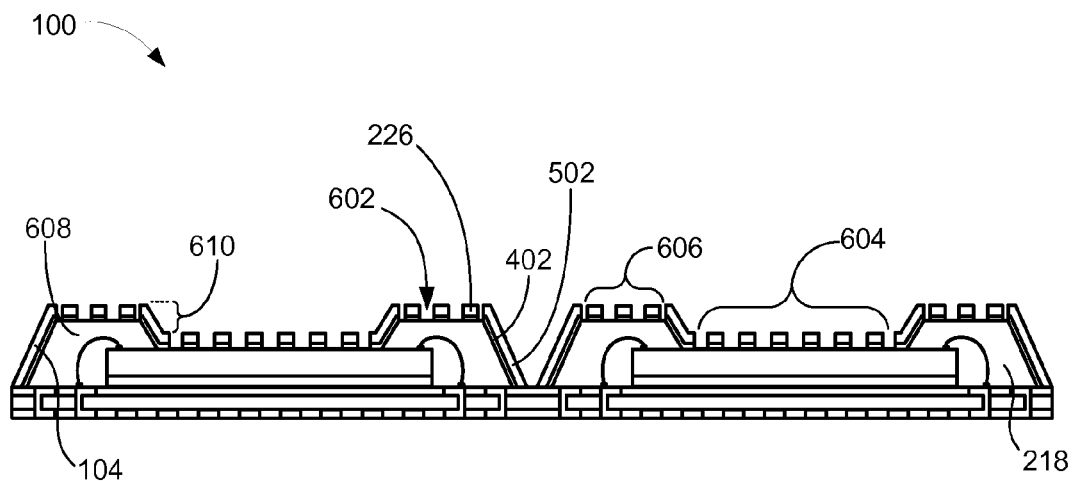
FIG. 6 is the integrated circuit package system of FIG. 2 in an etch phase of manufacture.

Referring now to FIG. 6, therein is shown the integrated circuit package system 100 of FIG. 2 in an etch phase of manufacture. The integrated circuit package system 100 is shown having a pattern 602 etched through the seed layer 402 and the thick metal layer 502. The pattern 602 etched includes an inner array 604, of the connection points 226, formed in the central portion bordered, on at least two opposing sides, by an outer array 606, of the connection points 226 formed in the peripheral portions to border the inner array 604. The outer array 606 is spaced vertically higher than the inner array 604 to form two levels of the connection points 226 because the outer array 606 is formed on mold risers 608 that provide a standoff height 610 between the top of the inner array 604 and the top of the outer array 606. The inner array 604 and the outer array 606 are exposed from the encapsulation 218, above the first device 206 of FIG. 2, for further connection of an external device. The connection points 226 are visible in this phase of manufacture. The connection points 226 and the RDL 104 are both formed from the pattern 602 etched through the seed layer 402 and the thick metal layer 502 and thus of the same material.

Figure 7:
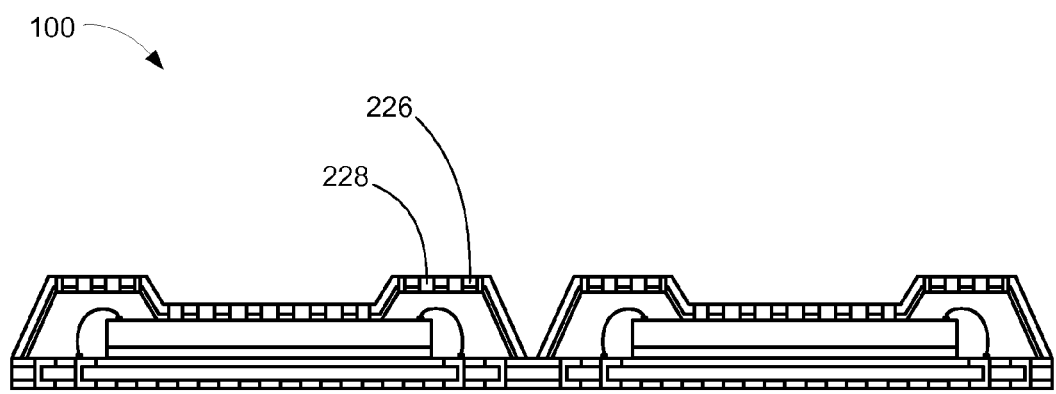
FIG. 7 is the integrated circuit package system of FIG. 2 in a solder mask phase of manufacture.

Referring now to FIG. 7, therein is shown the integrated circuit package system 100 of FIG. 2 in a solder mask phase of manufacture. The integrated circuit package system 100 is shown having the solder mask 228 deposited between the connection points 226.

Figure 8:
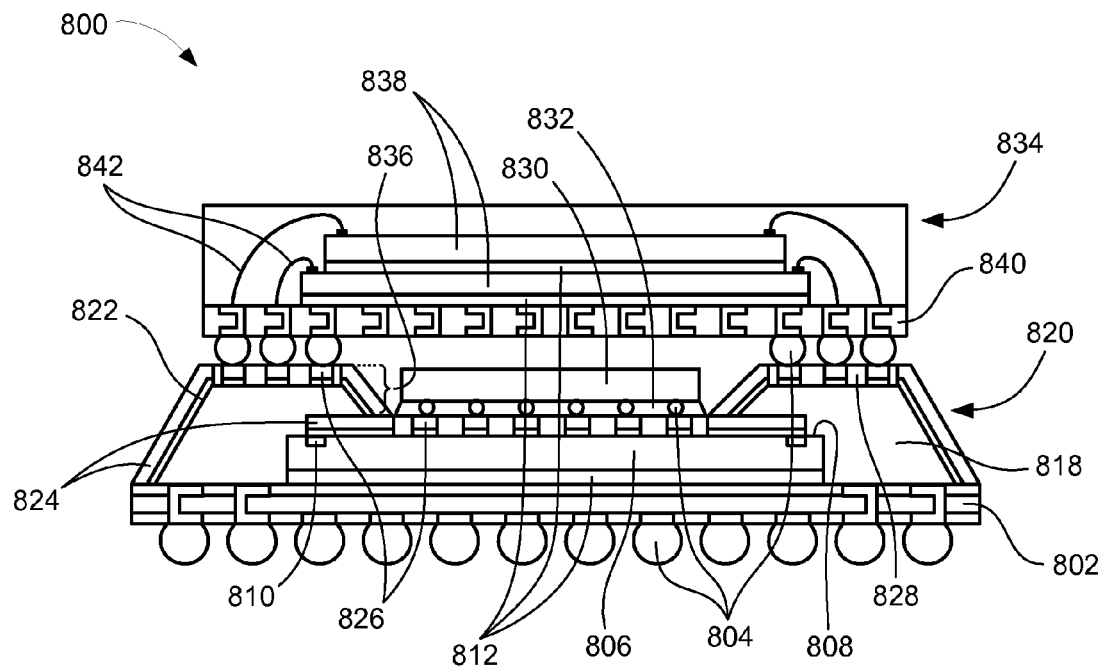
FIG. 8 is a cross-sectional view of an integrated circuit package system in a second embodiment of the present invention.

Referring now to FIG. 8, therein is shown a cross-sectional view of an integrated circuit package system 800 in a second embodiment of the present invention. The integrated circuit package system 800 is shown having a substrate 802 such as a laminated plastic or ceramic substrate.

Mounted below the substrate 802 are interconnects, such as solder balls 804. Mounted above the substrate 802 is an internal device 806 such as an integrated circuit die with a functional side 808 and internal device bond-pads 810.

The internal device 806 is attached to the substrate 802 with a die attach adhesive 812. Partially encapsulating the internal device 806 is an encapsulation 818. The encapsulation 818, such as an epoxy mold compound, has mold risers 820.

The encapsulation 818 has an outer surface 822. Attached to the outer surface 822 is a redistribution line (RDL) 824. The RDL 824 conducts electrical signals, routing them between connection points 826.

The RDL 824 covers the outer surface 822 of the encapsulation 818 and a portion of the functional side 808 of the internal device 806. The RDL 824 may also have a solder mask 828 such as a liquid photoimageable solder mask (LPSM) or dry film photoimageable solder mask (DFSM).

The solder mask 828 prevents solder from bridging between the connection points 826 on the RDL 824, thereby preventing short circuits. Mounted above the internal device 806 and the RDL 824 is a first external device 830 such as a wafer level chip scale package (WLCSP), a redistributed line (RDL) die, or an area array package.

The first external package 830 is connected to the RDL 824 with the solder balls 804. Between the solder balls 804 is an under-fill 832. The under-fill 832 helps to stabilize the first external device 830 and to secure the solder balls 804.

Mounted above the first external device 830 is a second external device 834. The second external device 834 is connected to the mold risers 820 with the solder balls 804. The mold risers 820 provide a standoff height 836, which allows the second external device 834 to have a finer pitch.

The second external device 834 is shown having two wire-bonded die 838 connected to an external device substrate 840 with bond wires 842. The two wire-bonded die 838 are attached with the die attach adhesive 812.

The RDL 824 electrically connects the substrate 802 to the second external device 834, the first external device 830 and the internal device 806.

Figure 9:
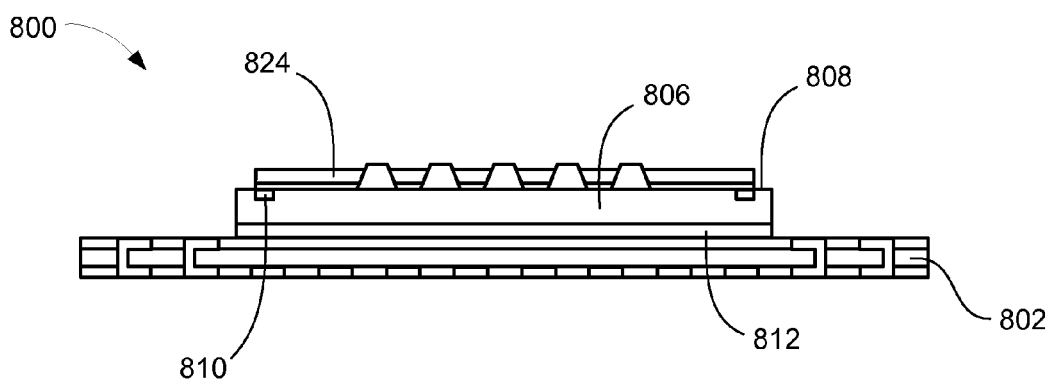
FIG. 9 is the integrated circuit package system of FIG. 8 in a device-mounting phase of manufacture.

Referring now to FIG. 9, therein is shown the integrated circuit package system 800 of FIG. 8 in a device-mounting phase of manufacture. The integrated circuit package system 800 is shown having the RDL 824 attached to the functional side 808 of the internal device 806.

The RDL 824 electrically connects the internal device bond-pads 810. The internal device 806 is attached to the substrate 802 with the die attach adhesive 812. Importantly, the RDL 824 is already on the internal device 806 prior to an encapsulation phase.

Figure 10:
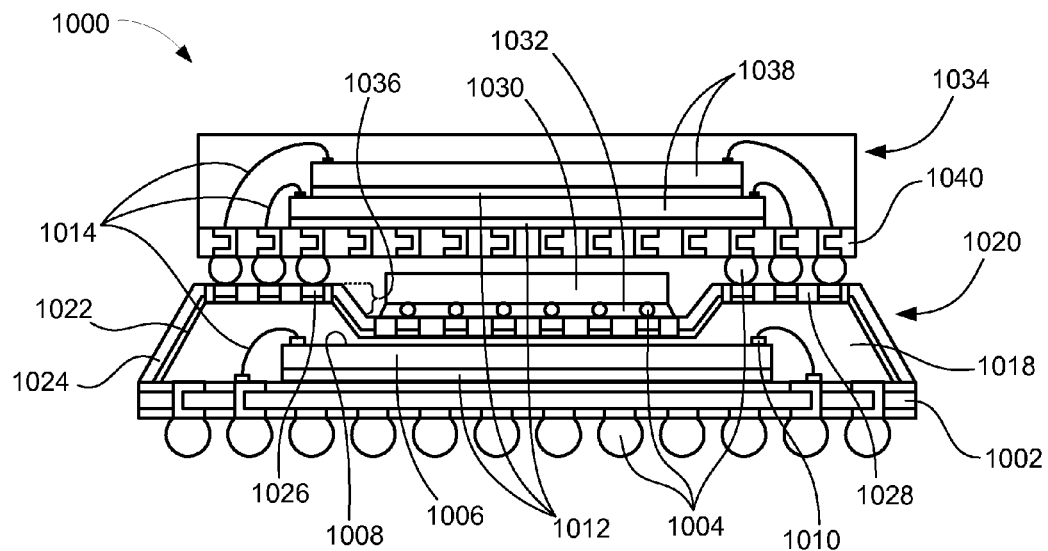
FIG. 10 is a cross-sectional view of an integrated circuit package system in a third embodiment of the present invention.

Referring now to FIG. 10, therein is shown a cross-sectional view of an integrated circuit package system 1000 in a third embodiment of the present invention. The integrated circuit package system 1000 is shown having a substrate 1002 such as a laminated plastic or ceramic substrate.

Mounted below the substrate 1002 are interconnects, such as solder balls 1004. Mounted above the substrate 1002 is an internal device 1006 such as a wire-bonded die with a functional side 1008 and internal device bond-pads 1010.

The internal device 1006 is attached to the substrate 1002 with a die attach adhesive 1012. The functional side 1008 of the internal device 1006 is connected to the substrate 1002 with bond wires 1014.

Fully encapsulating the internal device 1006 is an encapsulation 1018. The encapsulation 1018, such as an epoxy mold compound, has mold risers 1020. The encapsulation 1018 has an outer surface 1022. Attached to the outer surface 1022 is a redistribution line (RDL) 1024. The RDL 1024 conducts electrical signals, routing them between connection points 1026.

The RDL 1024 covers the outer surface 1022 of the encapsulation 1018 and does not contact the functional side 1008 of the internal device 1006. The RDL 1024 may also have a solder mask 1028 such as a liquid photoimageable solder mask (LPSM) or dry film photoimageable solder mask (DFSM).

The solder mask 1028 prevents solder from bridging between the connection points 1026 on the RDL 1024, thereby preventing short circuits. Mounted above the internal device 1006 and the RDL 1024 is a first external device 1030 such as a wafer level chip scale package (WLCSP), a redistributed line (RDL) die, or an area array package.

The first external package 1030 is connected to the RDL 1024 with the solder balls 1004. Between the solder balls 1004 is an under-fill 1032. The under-fill 1032 helps to stabilize the first external device 1030 and to secure the solder balls 1004.

Mounted above the first external device 1030 is a second external device 1034. The second external device 1034 is connected to the mold risers 1020 with the solder balls 1004. The mold risers 1020 provide a standoff height 1036, which allows the second external device 1034 to have a finer pitch.

The second external device 1034 is shown having two wire-bonded die 1038 connected to an external device substrate 1040 with the bond wires 1014. The two wire-bonded die 1038 are attached with the die attach adhesive 1012.

The RDL 1024 electrically connects the substrate 1002 to the second external device 1034, and the first external device 1030.

Figure 11:
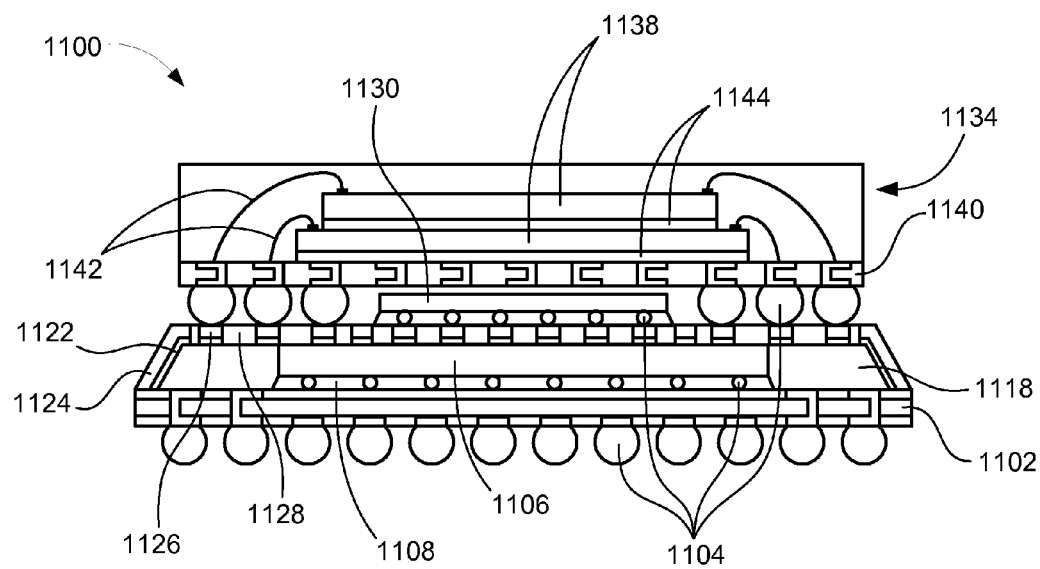
FIG. 11 is a cross-sectional view of an integrated circuit package system in a fourth embodiment of the present invention.

Referring now to FIG. 11, therein is shown a cross-sectional view of an integrated circuit package system 1100 in a fourth embodiment of the present invention. The integrated circuit package system 1100 is shown having a substrate 1102 such as a laminated plastic or ceramic substrate.

Mounted below the substrate 1102 are interconnects, such as solder balls 1104. Mounted above the substrate 1102 is an internal device 1106 such as a flip chip. The internal device 1106 is connected to the substrate 1102 the solder balls 1104. Between the solder balls 1104 is an under fill 1108.

Fully encapsulating the internal device 1106 is an encapsulation 1118. The encapsulation 1118, such as an epoxy mold compound. The encapsulation 1118 has an outer surface 1122. Attached to the outer surface 1122 is a redistribution line (RDL) 1124. The RDL 1124 conducts electrical signals, routing them between connection points 1126.

The RDL 1124 covers the outer surface 1122 of the encapsulation 1118 and does not contact the internal device 1106. The RDL 1124 may also have a solder mask 1128 such as a liquid photoimageable solder mask (LPSM) or dry film photoimageable solder mask (DFSM).

The solder mask 1128 prevents solder from bridging between the connection points 1126 on the RDL 1124, thereby preventing short circuits. Mounted above the internal device 1106 and the RDL 1124 is a first external device 1130 such as a wafer level chip scale package (WLCSP), a redistributed line (RDL) die, or an area array package.

The first external package 1130 is connected to the RDL 1124 with the solder balls 1104. Between the solder balls 1104 is the under-fill 1108. The under-fill 1108 helps to stabilize the first external device 1130 and to secure the solder balls 1104.

Mounted above the first external device 1130 is a second external device 1134. The second external device 1134 is connected to the RDL 1124 with the solder balls 1104. The second external device 1134 is shown having two wire-bonded die 1138 connected to an external device substrate 1140 with bond wires 1142.

The two wire-bonded die 1138 are attached with a die attach adhesive 1144. The RDL 1124 electrically connects the substrate 1102 to the second external device 1134, and the first external device 1130.

Figure 12:
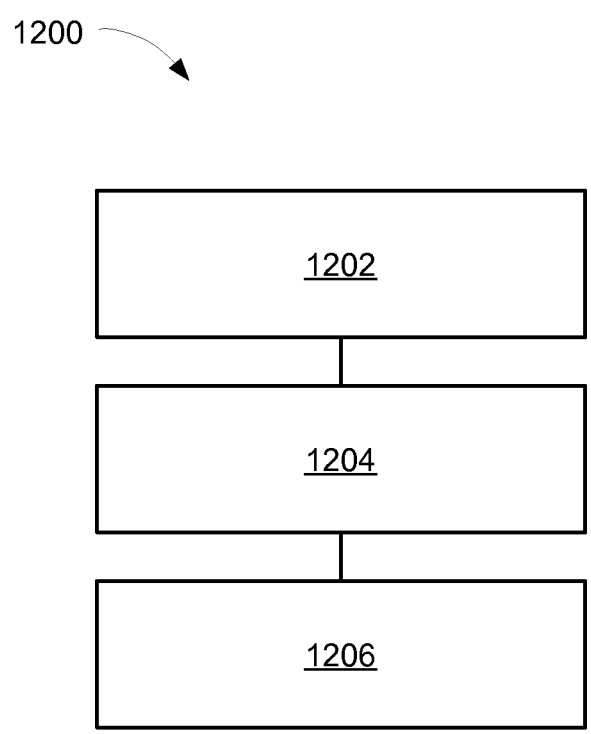
FIG. 12 is a flow chart of a system for manufacturing the integrated circuit package system of FIG. 1 in an embodiment of the present invention.

Referring now to FIG. 12, therein is shown a flow chart of a system 1200 for manufacturing the integrated circuit package system 100 of FIG. 1 in an embodiment of the present invention. The system 1200 includes providing an internal device in a block 1202; encapsulating the internal device with an encapsulation having an outer surface in a block 1204; and forming a redistribution line having connection points on the outer surface of the encapsulation in a block 1206.

Thus, it has been discovered that the redistribution on encapsulation of the present invention furnishes important and heretofore unknown and unavailable solutions, capabilities, and functional aspects for package on package configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
providing a substrate;
providing an internal device on and above the substrate;
encapsulating the internal device with an encapsulation having an outer surface;
forming a redistribution line, directly on the outer surface, the redistribution line having:
a central portion in direct contact with the internal device, the central portion completely within the width of the internal device and not extending beyond edges thereof,
peripheral portions around the central portion, the peripheral portions extending above the internal device and beyond the edges thereof such that sections of the peripheral portions are above the substrate,
interior portions between the central portion and the peripheral portions, the interior portions tapering from the peripheral portions to the central portion, the interior portions completely within the width of the internal device and not extending beyond the edges thereof,
exterior portions in contact with the peripheral portions opposite the interior portions, the exterior portions tapering from the peripheral portions to make direct contact with the substrate;
forming an inner array and outer array of connection points, the inner array etched on the central portion and bordered on at least two opposing sides by the outer array, the outer array etched on the peripheral portion and elevated a standoff height higher than the inner array to form two levels of the connection points, the inner array and the outer array exposed from the encapsulation, the connection points connected by the redistribution line for conducting electrical signals between the connection points, the connection points and the redistribution line formed of the same material;
mounting a first external device above the inner array on the central portion of the redistribution line, the first external device above the substrate, above portions of the encapsulation, and above the internal device, wherein an upper surface of the first external device is at a higher vertical elevation than the peripheral portions, the interior portions, and the exterior portions of the redistribution line; and
connecting the first external device to the redistribution line with an interconnect below the first external device, the interconnect in direct contact with the central portion of the redistribution line, the interconnect being above the substrate, above portions of the encapsulation, and above the internal device, the interconnect and the interior portions being at substantially similar horizontal axis.

2. The method as claimed in claim 1 further comprising:
depositing an insulator between the connection points on the redistribution line.

3. The method as claimed in claim 1 wherein:
encapsulating the internal device with the encapsulation includes encapsulating with the encapsulation having a mold riser providing the standoff height.

4. The method as claimed in claim 1 further comprising:
forming the redistribution line on an exposed surface of the internal device.

5. The method as claimed in claim 1 further comprising:
mounting an under-fill between the first external device and the redistribution line.

6. An integrated circuit package system comprising:
a substrate;
an internal device on and above the substrate;
an encapsulation having an outer surface encapsulating the internal device;
a redistribution line, formed directly on the outer surface, the redistribution line having:

a central portion in direct contact with the internal device, the central portion completely within the width of the internal device and not extending beyond edges thereof, peripheral portions around the central portion, the peripheral portions extending above the internal device and beyond the edges thereof such that sections of the peripheral portions are above the substrate, interior portions between the central portion and the peripheral portions, the interior portions tapering from the peripheral portions to the central portion, the interior portions completely within the width of the internal device and not extending beyond the edges thereof, exterior portions in contact with the peripheral portions opposite the interior portions, the exterior portions tapering from the peripheral portions to make direct contact with the substrate;

an inner array and an outer array of connection points, the inner array etched on the central portion and bordered on at least two opposing sides by the outer array, the outer array etched on the peripheral portion and elevated a standoff height higher than the inner array to form two levels of the connection points, the inner array and the outer array exposed from the encapsulation, the connection points connected by the redistribution line for conducting electrical signals between the connection points, the connection points and the redistribution line formed of the same material;

a first external device mounted above the inner array on the central portion of the redistribution line, the first external device above the substrate, above portions of the encapsulation, and above the internal device, wherein an upper surface of the first external device is at a higher vertical elevation than the peripheral portions, the interior portions, and the exterior portions of the redistribution line; and an interconnect below the first external device for connecting the first external device to the redistribution line, the interconnect in direct contact with the central portion of the redistribution line, the interconnect being above the substrate, above portions of the encapsulation, and above the internal device, the interconnect and the interior portions being at substantially similar horizontal axis.

7. The system as claimed in claim 6 further comprising:
an insulator deposited between the connection points on the redistribution line.

8. The system as claimed in claim 6 wherein:
the encapsulation has a mold riser providing the standoff height.

9. The system as claimed in claim 6 further comprising:
an exposed surface of the internal device and having the redistribution line formed thereover.

10. The system as claimed in claim 6 further comprising:
an under-fill mounted between the first external device and the redistribution line.

* * * * *